(12) United States Patent
Oms

(10) Patent No.: US 10,903,640 B2
(45) Date of Patent: Jan. 26, 2021

(54) ELECTRICAL LINK COMPRISING AN ELECTRICAL PROTECTION DEVICE

(71) Applicant: Airbus Operations (S.A.S.), Toulouse (FR)

(72) Inventor: Patrick Oms, Colomiers (FR)

(73) Assignee: Airbus Operations (S.A.S.), Toulouse (FR)

( * ) Notice: Subject to any disclaimer, the term of this patent is extended or adjusted under 35 U.S.C. 154(b) by 253 days.

(21) Appl. No.: 16/186,109

(22) Filed: Nov. 9, 2018

(65) Prior Publication Data
US 2019/0148928 A1    May 16, 2019

(30) Foreign Application Priority Data

Nov. 13, 2017 (FR) ...................................... 17 60650

(51) Int. Cl.
*H02H 1/00* (2006.01)
*G01R 31/02* (2006.01)
(Continued)

(52) U.S. Cl.
CPC ........... *H02H 1/003* (2013.01); *G01R 31/006* (2013.01); *G01R 31/50* (2020.01); *H02H 1/0015* (2013.01);
(Continued)

(58) Field of Classification Search
CPC ........ H02H 3/093; H02H 1/003; H02H 7/228; H02H 1/0015; H02H 5/10; H02H 1/00;
(Continued)

(56) References Cited

U.S. PATENT DOCUMENTS

2005/0128661 A1* 6/2005 Maeckel ................ H02H 5/043
                                                                361/42
2006/0017445 A1    1/2006 Flock et al.
(Continued)

FOREIGN PATENT DOCUMENTS

EP         1 114 752 A2     7/2001

OTHER PUBLICATIONS

French Search Report for Application No. 1760650 dated Aug. 7, 2018.

*Primary Examiner* — Jermele M Hollington
*Assistant Examiner* — Suresh K Rajaputra
(74) *Attorney, Agent, or Firm* — Jenkins, Wilson, Taylor & Hunt, P.A.

(57) ABSTRACT

An electrical link includes an electrical protection device. The electrical link, for linking an AC high-voltage generator to a user apparatus, includes an electrical conductor surrounded by a first inner insulating envelope. An electrical protection device includes a conductive sheath around the inner insulating envelope. A fixed DC current generator is connected to a current injection point of the conductive sheath. A circuit breaker that can be activated is on the electrical conductor and configured to break the electrical link when it is activated. A detection module is connected to a current tap-off point of the conductive sheath and to the circuit breaker, the detection module being configured to detect a break in the conductive sheath, a current leak out of the electrical conductor or a current leak out of the sheath and to activate the circuit breaker.

12 Claims, 4 Drawing Sheets

(51) Int. Cl.
*H02H 3/093* (2006.01)
*G01R 31/00* (2006.01)
*H02H 5/10* (2006.01)
*H02H 7/22* (2006.01)
*G01R 31/50* (2020.01)

(52) U.S. Cl.
CPC .............. *H02H 3/093* (2013.01); *H02H 5/10* (2013.01); *H02H 7/228* (2013.01)

(58) Field of Classification Search
CPC ...... G01R 31/50; G01R 31/006; G01R 31/02; G01R 31/00
See application file for complete search history.

(56) References Cited

U.S. PATENT DOCUMENTS

2006/0149427 A1    7/2006  Evans
2018/0323602 A1*  11/2018  Oms ..................... H02H 1/003

* cited by examiner

ELECTRICAL LINK COMPRISING AN ELECTRICAL PROTECTION DEVICE

CROSS-REFERENCE TO RELATED APPLICATION

This application claims the benefit of and priority to French patent application number 17 60650, filed on Nov. 13, 2017, the entire disclosure of which is incorporated by reference herein.

TECHNICAL FIELD

The disclosure herein relates to an electrical link for the transmission of an AC high voltage to a user apparatus, the electrical link comprising an electrical protection device for supplying electrical power in a secure manner. The disclosure herein also relates to a method for the secure supply of electrical power to a user apparatus of a vehicle, in particular of an aircraft, via an electrical link.

BACKGROUND

An electrical installation on an aircraft, for example a transport plane, comprises an electrical generator linked to a user apparatus to be supplied with electrical power via an electrical link formed of an electrical conductor surrounded by an insulating envelope. The electrical link comprises a circuit breaker device for monitoring the parameters of the electrical signal flowing through the link between the generator and the user apparatus in order to interrupt an overload current or a short-circuit current in the electrical conductor.

Electrical power consumed on aircraft is constantly increasing. This trend inevitably leads to an increase in the voltage levels of the electrical generators on aircraft, which were traditionally 115 volts AC and 28 volts DC.

Provision is currently made for voltages of the order of +/−270 volts AC. In the future, even higher voltages are envisaged, possibly reaching 1500 volts AC.

Such voltage values give rise to new problems on aircraft. For example, electric arcs may appear when a current leaks out of the electrical link. A parallel arc between an electrical conductor supplying power to an apparatus and the conductive structure of an aircraft, or between two adjacent electrical conductors, could damage the user apparatus.

The circuit breaker devices of the prior art are not optimized for making safe the transmission of power via the electrical links of an installation using such voltages, since these devices break the power line only at high current levels (the current is necessarily higher than the current consumed by the loads), and after delays possibly reaching several seconds, therefore resulting in damage to the surroundings due to the temperatures brought about by the electric arcs and ejections of molten metal. Specifically, at such voltages, with the circuit breakers of the prior art, it is necessary to observe substantial safety distances between a strand including power supply cables and the airframe of the aircraft, or between a strand including power supply cables and another strand including data transmission cables, in order to prevent a potential electric arc in the strand including power supply cables from thermally damaging the conductive structure of the aircraft or the strand including data transmission cables. These safety obligations result in substantial space constraints in an aircraft.

There is a need to find a device for the electrical protection of an electrical link that makes it possible to secure the supply of AC high-voltage electrical power to a user apparatus of a vehicle and that completely or partly overcomes the drawback of the prior art mentioned above.

SUMMARY

To this end, the disclosure herein relates to an electrical link intended for linking an AC high-voltage generator to a user apparatus. According to the disclosure herein, the electrical link comprises an electrical conductor surrounded by an inner insulating envelope and an electrical protection device comprising:

a conductive sheath arranged around the inner insulating envelope;

a fixed DC current generator connected to a current injection point of the conductive sheath;

a circuit breaker that can be activated arranged on the electrical conductor and configured to break the electrical link when it is activated; and a detection module connected to a current tap-off point of the conductive sheath and to the circuit breaker, the detection module being configured to detect a current leak out of the electrical conductor and to activate the circuit breaker, the detection module comprising:

a shunt connected by a first terminal between the tap-off point of the conductive sheath and a current measurement point and by a second terminal to a ground, a test voltage, reflecting a current passing through the shunt, being measured across the terminals of the shunt;

an active current measurement module configured to produce a first voltage that is representative of an active current passing through the shunt, the first voltage being obtained on the basis of the measurement of the AC component of the test voltage;

a DC current measurement module configured to produce a second voltage that is representative of the DC current passing through the shunt, the second voltage being obtained on the basis of the measurement of the DC component of the test voltage;

a module for detecting deviation in the active and DC currents that is configured to compare the values of the first and second voltages produced by the active and DC current measurement modules, respectively, with predetermined reference values and to activate or not to activate the circuit breaker depending on the result of these comparisons.

Thus, the electrical link makes it possible, by virtue of the electrical protection device, to check the integrity of the electrical conductor conveying the AC high voltage to the user apparatus as well as the integrity of the conductive sheath that forms part of the electrical protection device and to activate the circuit breaker if a current leakage is detected.

The disclosure herein also relates to a method for the secure supply of electrical power to a user apparatus of a vehicle via an electrical link connected between the user apparatus and a generator delivering an AC high voltage, the vehicle including a ground-forming conductive structure, the electrical link comprising:

an electrical conductor surrounded by an inner insulating envelope; and an electrical protection device comprising:

a conductive sheath arranged around an inner insulating envelope;

a fixed DC current generator connected to a current injection point of the conductive sheath;

a circuit breaker that can be activated arranged on the electrical conductor and configured to break the electrical link when it is activated;

a detection module comprising a shunt connected to an electrical link comprised between a tap-off point of the conductive sheath and a current measurement point and to a ground, an active current measurement module comprising a multiplier element comprising a first input terminal connected to the AC high-voltage generator, a second input terminal connected to the current measurement point and a divider element comprising a first input terminal connected to the AC high-voltage generator, a second input terminal connected to an output terminal of the multiplier element, and a DC current measurement module and a module for detecting deviation in the active and DC currents, the module for detecting deviation in the active and DC currents comprising a first comparator, a second comparator and a microcontroller.

The method according to the disclosure herein comprises the following successive steps:

a step of injecting a bias current by the fixed DC current generator at the current injection point;

a step of measuring the DC component of a test voltage across the terminals of the shunt, implemented by the DC current measurement module, the test voltage reflecting the current passing through the shunt;

a step of measuring the AC component of the test voltage across the terminals of the shunt, implemented by the active current measurement module;

a step of generating a first voltage that is representative of the active current passing through the shunt obtained on the basis of the measurement of the AC component of the test voltage, implemented by the active current measurement module;

a step of generating a second voltage that is representative of the DC current passing through the shunt obtained on the basis of the measurement of the DC component of the test voltage, implemented by the DC current measurement module;

a step of comparing the value of the first voltage and the value of the second voltage with predetermined reference values, respectively;

a step of monitoring, implemented by the microcontroller, the state of the output signal of the first comparator and/or of the second comparator, the state being either a first state if the first voltage is higher than the predetermined reference value and/or if the second voltage is lower than the predetermined reference value, the first state indicating the presence of a current leak between the electrical conductor and the conductive sheath, or the presence of a current leak out of the conductive sheath, or else a second state;

a step of activating the circuit breaker, implemented by the microcontroller, if the output signal of the first comparator and/or of the second comparator is in the first state.

BRIEF DESCRIPTION OF THE DRAWINGS

Features of the disclosure herein mentioned above, along with others, will become more clearly apparent on reading the following description of one exemplary embodiment, the description being given with reference to the appended, example drawings, in which.

DETAILED DESCRIPTION

Figure 1:
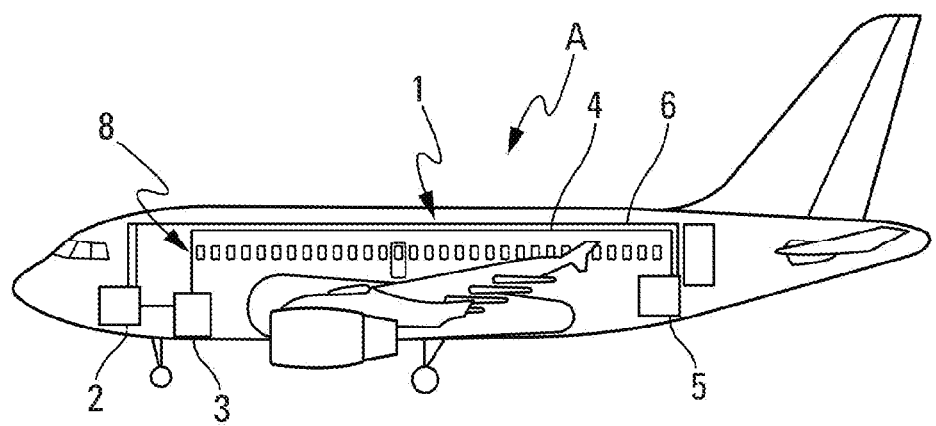
FIG. 1 shows an aircraft including an electrical installation having a power source connected to a user apparatus via an electrical link and a current return line and a device for the electrical protection of the electrical link according to one embodiment of the disclosure herein.

With reference to FIG. 1, an aircraft A includes an electrical installation having an AC high-voltage generator 2 connected to a user apparatus 5 via an electrical link 8 and comprising an electrical protection device 3 associated with the electrical link 8. The AC high-voltage generator 2 is furthermore linked to the user apparatus 5 by a current return line 6.

The high-voltage generator is, for example, capable of delivering a main AC voltage Up of the order of about 270 volts AC, or else about 540 volts AC.

Figure 4:
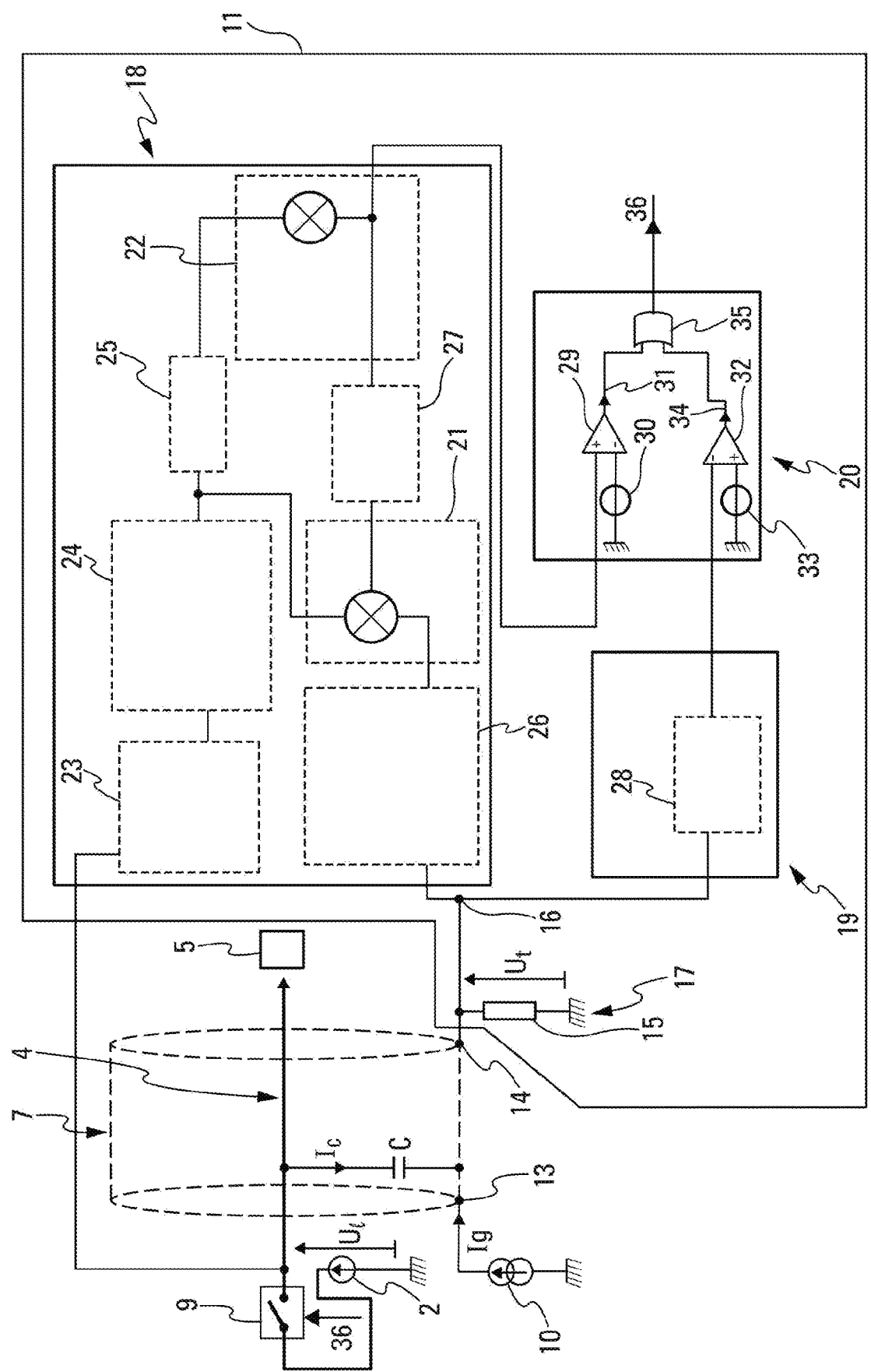
FIG. 4 shows a circuit diagram of the electrical installation shown in FIG. 2.

The aircraft A furthermore comprises a conductive structure (not shown) that is formed by any metal/conductive element of the aircraft that is at the reference potential and forms the ground 17 (visible in FIG. 4).

Figure 2:
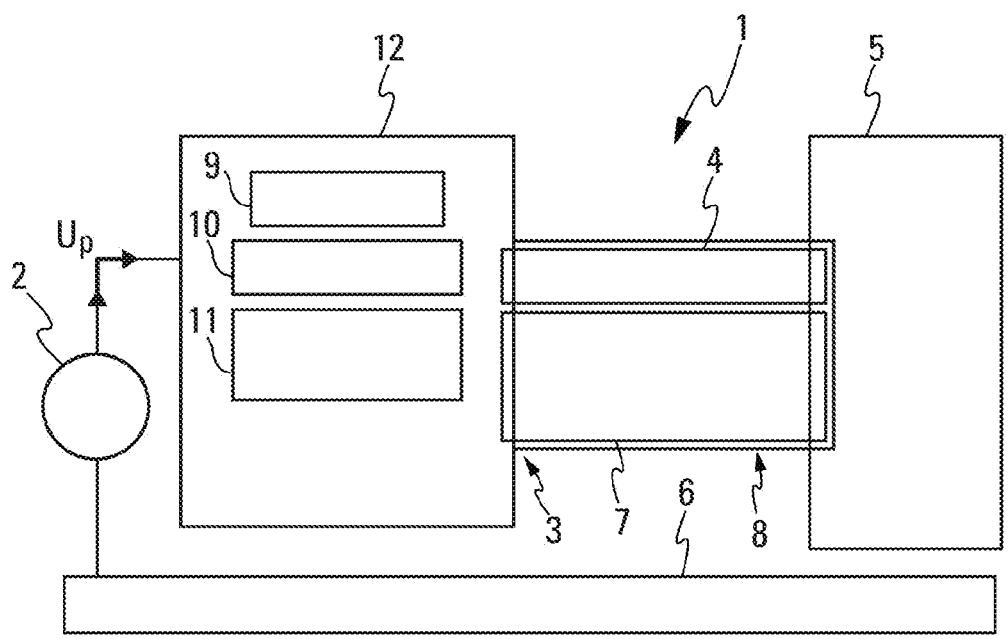
FIG. 2 shows a block diagram of the electrical installation shown in FIG. 1, and a depiction of the device for the electrical protection of the electrical link according to one embodiment of the disclosure herein.
Figure 3:
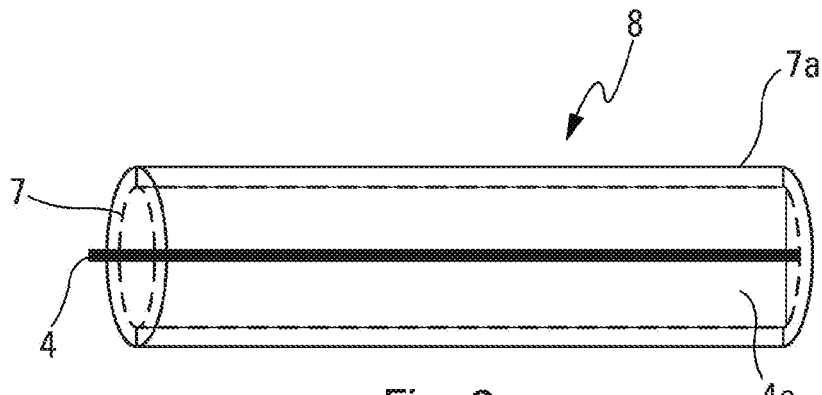
FIG. 3 shows a schematic view of a conductive sheath surrounding the electrical link and forming part of the electrical protection device according to the disclosure herein.

With reference to FIGS. 2 and 3 and according to the disclosure herein, the electrical link 8 comprises a conductor 4 surrounded by an electrically insulating envelope 4a (inner insulating envelope 4a hereinafter), for example a plastic sheath, and an electrical protection device 3 that comprises a part arranged on the inner insulating envelope 4a of the electrical conductor 4 and a part comprising electronic devices that are for example arranged in a secure housing 12.

The part arranged on the inner insulating envelope 4a comprises a conductive sheath surrounded by an electrically insulating envelope 7a (outer insulating envelope 7a hereinafter), the conductive sheath 7 surrounding the inner insulating envelope 4a of the electrical conductor 4.

As shown in FIG. 2, the part situated in the housing 12 comprises:

a circuit breaker 9 that can be activated and is linked to the AC high-voltage generator 2 and that, when it is activated in this respect, makes it possible to interrupt the delivery of the main AC voltage Up to the user apparatus 5. In a known manner, the circuit breaker 9 operates as a switch that, when it is activated, opens and thereby breaks the electrical link 8, de-energizing the electrical conductor 4;

a fixed DC current generator 10; and a detection module 11 for detecting a current leak out of the electrical conductor 4 or between the conductive sheath 7 and the exterior of the electrical link 8.

A current leak occurs when the electrical link 8 is damaged. For example, when the inner insulating envelope 4a is damaged, contact is made between the electrical conductor 4 and the conductive sheath 7. Similarly, when the outer insulating envelope 7a is faulty, the conductive sheath comes into contact with an outer element of the electrical link 8.

Damage to the conductor 8 may lead to the formation of a high-energy electric arc between the conductor 4 and the conductive structure of the aircraft, or the current return line 6, or another conductor at a potential other than that of the electrical conductor 4.

The electrical link 8 advantageously extends from the housing 12 to the user apparatus 5 (only a portion of the electrical link has been shown in FIG. 4).

The fixed DC current generator 10 carries out the function of current-biasing the conductive sheath 7 by injecting a DC bias current Ig into the conductive sheath 7 at a current injection point 13, which is, for example, located at the upstream end (housing 12 side) of the electrical link 8.

The fixed DC current generator 10 is preferably voltage-limited with a voltage limitation chosen so as not to be hazardous for human beings, typically a voltage Ug of less than 50 V. This preferred option makes it possible to add an additional degree of protection for human beings.

For example, the DC bias current Ig, delivered by the generator 10, is 0.5 A for a main AC voltage Up of 540 volts AC delivered by the AC high-voltage generator 2.

In one preferred embodiment, shown in FIG. 4, the detection module 11 is arranged downstream of the conductive sheath 7 and comprises a shunt 15, an active current measurement module 18, a DC current measurement module 19 and a module for detecting deviation in the active and DC currents 20. The arrangement and the operation of these various elements are explained below.

The shunt 15, the value Rs of which is known, is arranged downstream of a tap-off point 14 and upstream of a current measurement point 16. The test voltage Ut that can be measured across the terminals of the shunt 15 is proportional to the value Rs and to a test current It (Ut=Rs·It). The test current It corresponds to the sum of two currents, namely, on the one hand, the bias current Ig produced by the fixed DC current generator 10 at the current injection point 16 and, on the other hand, an AC current Ic that is proportional to an AC voltage Uc. The AC voltage Uc is created by capacitive crosstalk between the electrical conductor 4 and the conductive sheath 7. This capacitive crosstalk is akin to the presence of a capacitor of capacitive value C between the electrical conductor 4 and the conductive sheath 7, the value of which depends on multiple parameters (lengths and internal radii of the electrical conductor 4 and of the conductive sheath 7, relative permittivity of the inner insulating envelope 4a). The voltage Uc is written as:

$$Uc=Up \cdot Rs/(Rs+1/(2 \cdot \pi \cdot F \cdot C)),$$

where F represents the frequency of the AC high-voltage generator 2.

In the absence of a leakage current, i.e. in a nominal mode, the voltage Ut comprises a DC component corresponding to a voltage Ug, proportional to the bias current Ig, and an AC component Uc. Additionally, since the coupling between the electrical conductor 4 and the conductive sheath 7 is purely capacitive, the AC voltage Uc exhibits a phase shift $\varphi=-\pi/2$ with respect to the main AC voltage Up.

Figure 5:
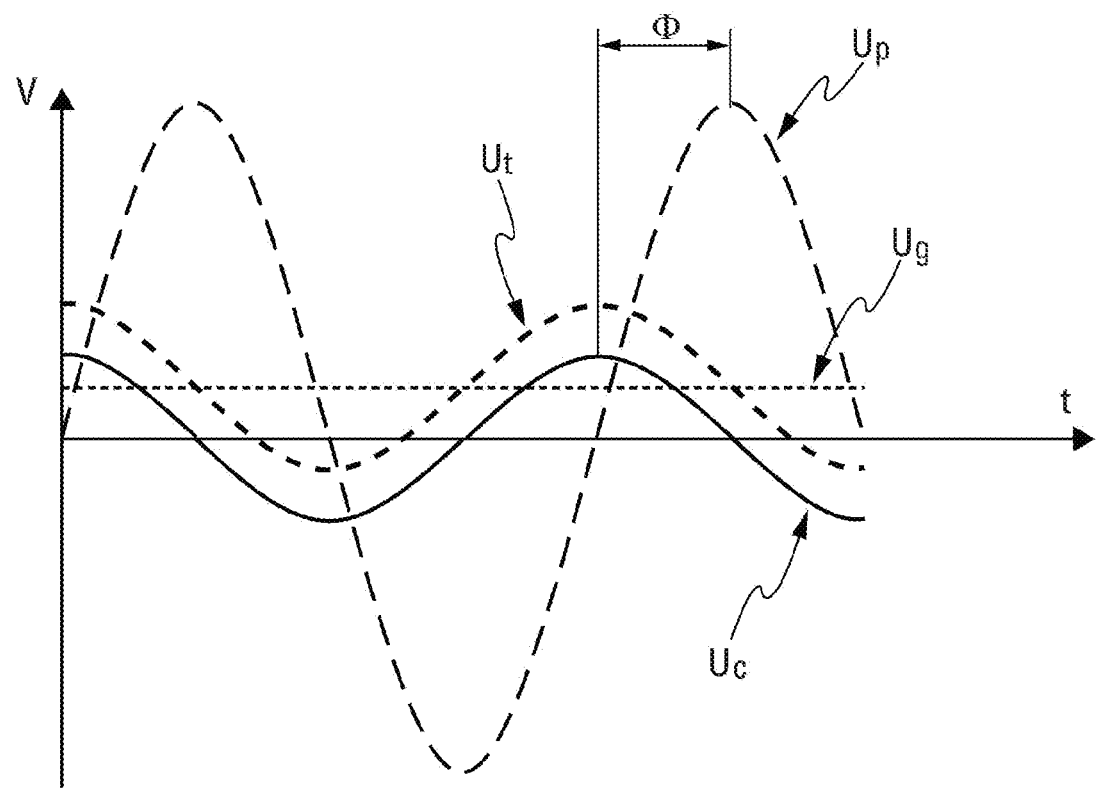
FIG. 5 illustrates the variation with time of the voltages across the terminals of the detection module, namely the main AC high voltage, the test voltage and the DC and AC components of the test voltage.

FIG. 5 shows the behavior of the variations, in volts V, with time t of the test voltage Ut, of the AC voltage Uc, of a voltage Ug that is proportional to the bias current Ig and of the main AC voltage Up.

As shown in FIG. 4, the active current measurement module 18 comprises two input terminals that are connected to the AC high-voltage generator 2 and to the current measurement point 16, respectively. These input terminals deliver the main AC voltage Up and the test voltage Ut, respectively. The active current measurement module 18 comprises a multiplier element 21 that is configured to multiply the main AC voltage Up by the test voltage Ut and to determine an instantaneous power value P. Once the instantaneous power value P has been obtained, the multiplier element 21 transmits the instantaneous power value P to a divider element 22 via a filter 27 allowing this instantaneous power to be transformed into mean active power. The divider element 22 is configured to divide this mean active power value by the RMS value of the main AC voltage Up in order to determine then to transmit a first voltage Uact, this first voltage Uact being the voltage reflecting the active current passing through the shunt 15, referred to as the reflection voltage Uact throughout the rest of the description.

By way of example, the multiplier 21 and divider 22 elements may comprise Analog Devices AD633 components.

The DC current measurement module 19 is connected downstream of the shunt 15 and upstream of the module for detecting deviation in the active and DC currents 20. It is intended for the delivery of a second voltage Utdc and comprises a low-pass filter 28. This low-pass filter 28 is configured to allow only the DC component Utdc of the test voltage to pass, which corresponds, throughout the rest of the description, to the second voltage. By way of example, the low-pass filter 28 is a third-order filter.

The module for detecting deviation in the active and DC currents 20 is arranged downstream of the active and DC current measurement modules 18 and 19 and comprises a first and a second comparator 29 and 32 and a microcontroller 35.

Figure 7:
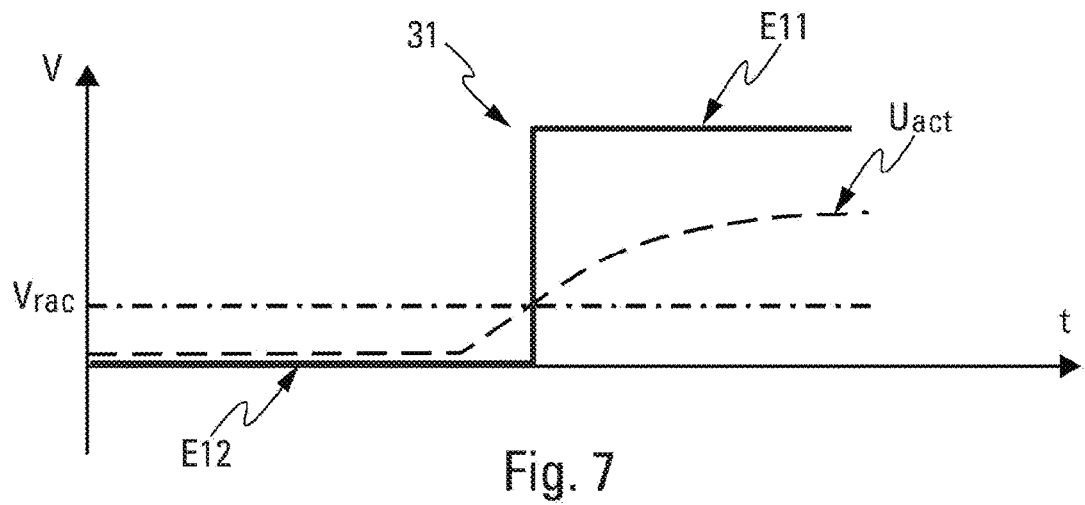
FIG. 7 illustrates the variation with time of the AC component of the test voltage in the presence of a current leak and of the second output signal of the first comparator.

The first comparator 29 is configured to compare the reflection voltage Uact with a reference voltage Vrac. The value of the reflection voltage Uact is delivered by the active current measurement module 18 to a first input terminal and the reference voltage Vrac is delivered to a second input terminal by a reference DC voltage generator 30. This reference DC voltage Vrac is defined so as to account for the normal and harmless leakage currents that can appear in the electrical installation. The first comparator 29 emits information on the result of the comparison in the form of an output signal 31, the state of which is representative of the result. In the example shown in FIG. 7, as the value of the reflection voltage Uact becomes higher than the reference DC voltage Vrac over time, the output signal 31 of the first comparator 29 transitions from a second state E12 to a first state E11.

Figure 9:
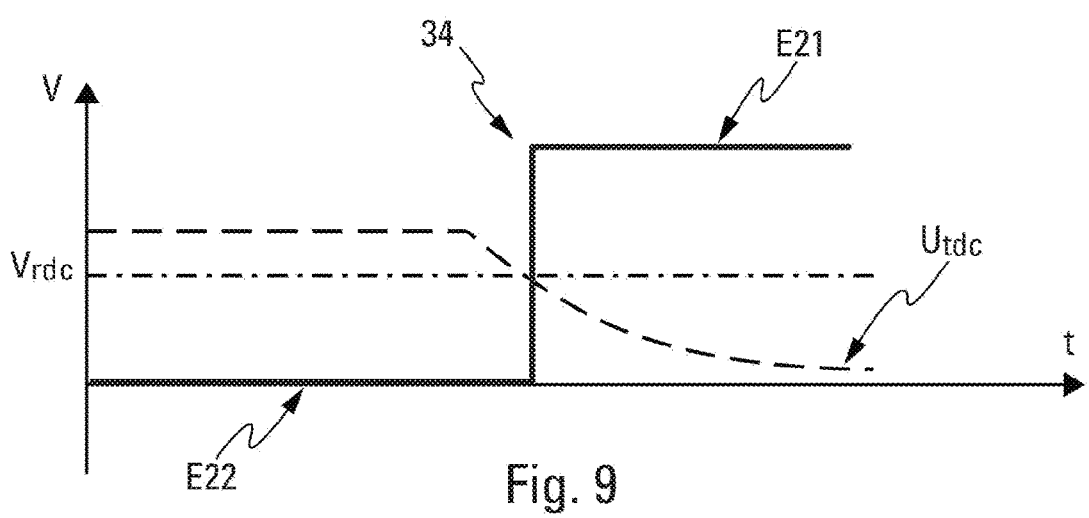
FIG. 9 illustrates the variation with time of the DC component of the test voltage in the presence of a current leak and of the first output signal of the second comparator.

The second comparator 32 is configured to compare the DC component Utdc of the test voltage Ut with a reference voltage Vrdc. The DC component Utdc of the test voltage Ut is delivered by the DC current measurement module 19 to a first input terminal and the reference voltage Vrdc is delivered to a second input terminal by a reference DC voltage generator 33. This reference DC voltage Vrdc is defined so as to account for the normal and harmless leakage currents that can appear in the electrical installation. Analogously to the first comparator 29, the second comparator 32 emits information on the result of the comparison in the form of an output signal 34, the state of which is representative of the result. As shown in FIG. 9, as the DC component of the test voltage Utdc becomes lower than the reference DC voltage Vrdc over time, the output signal 34 of the second comparator 32 transitions from a second state E22 to a first state E21.

The microcontroller 35 is connected between the first and second comparators 29 and 32 and the circuit breaker 9. The microcontroller 35 is configured to monitor a change of state of the output signals 31 and 34 of the first and second comparators 29 and 32, in order to detect a current leak between the electrical conductor 4 and the conductive sheath 7, or the presence of a current leak out of the conductive sheath 7 towards the structure of the aircraft or another conductor. This means that a change from a second state E12 to a first state E11 of the output signal 31 of the first comparator 29 and/or a change from a second state E22 to a first state E21 of the output signal 34 of the second comparator 32 is enough for the microcontroller 35 to send an activation signal to the circuit breaker 9.

In an embodiment, the active current measurement module 18 comprises an attenuator element 23 and a bandpass filter 24 that are connected together successively. These two elements are also connected upstream of the multiplier 21 and divider 22 elements and downstream of the AC high-voltage generator 2. The attenuator element 23 may comprise an operational amplifier in non-inverting configuration, configured to attenuate the value of the main AC voltage Up. The attenuation factor is defined so as to make the main AC voltage Up compatible with electrical elements suitable for low voltages (AC voltage lower than 15 volts AC). For example, the attenuation factor may be 1500. The attenuator element 23 delivers an attenuated main AC voltage Upat.

The bandpass filter 24 is configured to filter the attenuated main AC voltage Upat in order to remove any potential interference that could interfere with the detection of a current leak, for example the presence of partial discharges, of electromagnetic pulses, etc. By way of example, the bandpass filter 24 is a third-order filter.

According to one configuration, a converter element 25 is connected between the bandpass filter 24 and the divider element 22. The converter element 25 is configured to convert the attenuated main AC voltage Upat into a DC mean value of the RMS voltage Ueff. By way of example, the converter element 25 may include an Analog Devices AD636 component.

Additionally, another bandpass filter 26 is arranged between the current measurement point 16 and the multiplier element 21. The bandpass filter 26 is configured both to filter the test voltage Ut in order to remove any potential interference such as partial discharges or electromagnetic pulses and to remove the DC component from the test voltage Ut. The bandpass filter 26 then transmits only a filtered AC component of the test voltage Ut to the multiplier element 21. By way of example, the bandpass filter 26 is a third-order filter.

According to one particularity, the active current measurement module 18 comprises a low-pass filter 27, connected between the multiplier element 21 and the divider element 22. The low-pass filter 27 is configured to allow only the DC component of the instantaneous power value P transmitted by the multiplier element 21 to pass. By way of example, the low-pass filter 27 is a third-order filter.

The electrical link 8, such as described above, implements steps of a method for the secure supply of electrical power to a user apparatus 5 of a vehicle A, for example an aircraft.

In a current injection step, the fixed DC current generator 10 injects the bias current Ig at the injection point 13 of the conductive sheath 7. The bias current Ig and the AC current Ic, created by the capacitive crosstalk between the electrical conductor 4 and the electrical sheath 7, generate the test voltage Ut across the terminals of the shunt 15. The test voltage Ut therefore comprises a DC voltage Ug and an AC voltage Uc.

In nominal operation, i.e. in the absence of a current leak, the value of the DC voltage Ug is Rs·Ig. This voltage corresponds to the DC component of the test voltage Utdc, which is filtered, in a DC voltage measurement step, by the low-pass filter 28 of the DC current measurement module 19 then transmitted to the comparator 32. The comparator 32 compares it with the reference value Vrdc, the value of which is exactly Rs·Ig. The comparator 32 transmits the output signal 34, which is in a second state E22, to the microcontroller 35, which monitors any change of state of the output signal 34.

In an AC voltage measurement step, the main AC voltage Up is attenuated by a predetermined factor by the attenuator element 23 then filtered by the first bandpass filter 24. Additionally, the test voltage Ut is also filtered by the bandpass filter 26. This filtered test voltage Ut now comprises only the AC voltage Uc, which is representative of the capacitive coupling between the electrical conductor 4 and the electrical sheath 7. Furthermore, the bandpass filter 24 and the bandpass filter 26 are identical in order to maintain a phase shift φ, which is equal to $-\pi/2$ in the case that there is no leakage current, between the filtered test voltage Ut and the filtered attenuated AC voltage Upat, that is identical to the phase shift between the AC voltage Uta at the terminal of the shunt 15, which is equal to Uc in the absence of a leakage current, and the main AC voltage Up (see FIGS. 5 and 6).

Figure 6:
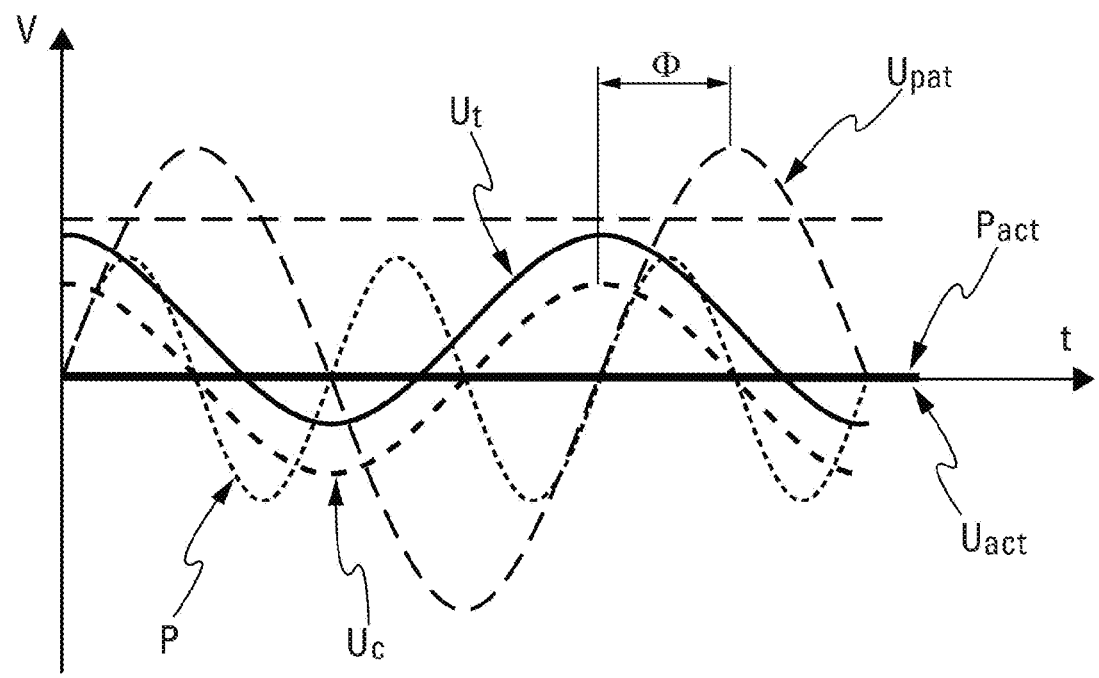
FIG. 6 shows the variation with time of the various voltages and of the instantaneous power value in the detection module in the absence of a current leak.
Figure 8:
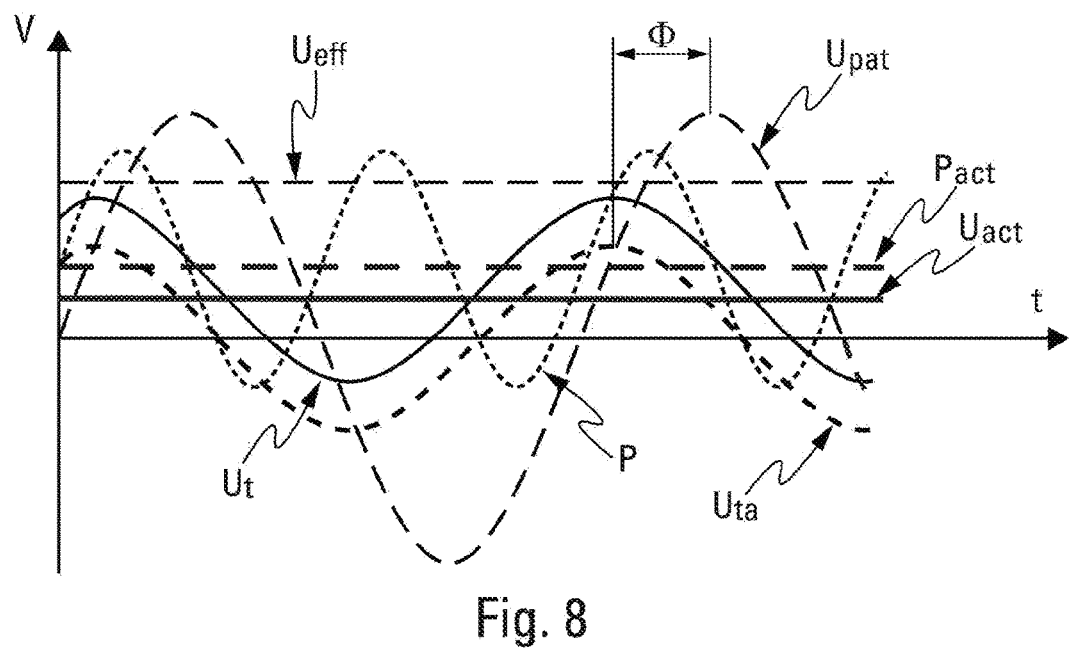
FIG. 8 shows the variation with time of the various voltages and powers in the detection module in the presence of a current leak.

The filtered attenuated main AC voltage Upat and the filtered test voltage Ut are multiplied, in a multiplication step, by the multiplier element 21. The result of this multiplication corresponds to an instantaneous power value P, which represents the AC power dissipated in the shunt 15. As shown in FIGS. 6 and 8, the instantaneous power value P is a sinusoidal function, the frequency of which is double the frequency of the attenuated main AC voltage Upat (or that of the AC voltage Uc). It also exhibits a phase shift φ=$-\pi/2$ with the attenuated main AC voltage Upat in the absence of a leakage current. The instantaneous power value P is written as:

$$P(t)=2\cdot(Upat\cdot Uta\cdot\cos(\varphi))+2\cdot(Upat\cdot Uta\cdot\cos(4\pi\cdot F+\varphi)).$$

The first term of the preceding formula corresponds to an active power Pact, which is a DC value. The second term of the formula corresponds to a reactive power Preact, which is an AC value. In order to remove this reactive power Preact, the low-pass filter 27 is used in a third filtering step. The low-pass filter 27 filters the power value P and transmits only its DC component, namely the mean active power Pact.

The mean active power Pact thus filtered is then divided, in a division step, by the value of the RMS voltage Ueff. The RMS voltage Ueff is a DC voltage obtained on the basis of the attenuated main AC voltage Upat by using the converter element 25 (see FIG. 8). The result of the division by the divider element 22 is the voltage Uact reflecting the active current passing through the shunt 15.

The active current measurement module 18 then transmits the value of the reflection voltage Uact to the comparator 29, which compares it with the reference value Vrac. In nominal mode, the phase shift $\varphi=-\pi/2$, present in the formula for the power value P, results in the nullification of the active power Pact and hence of the reflection voltage Uact. In this case, the comparator 29 transmits the output signal 31, which is in the second state E12, to the microcontroller 35, which monitors any change of state of the output signal 31.

However, in the case of a breakage in the conductive sheath 7 or a fault in the outer insulating envelope 7a, or of an interruption in the DC current Ig or when a current leak occurs between the conductive sheath 7 and, for example, the conductive structure of the aircraft A, the cessation of the DC current or the current leak results in a decrease in the voltage Ug across the terminals of the shunt 15. Since this voltage corresponds to the DC component of the test voltage Utdc, the DC current measurement module 19 measures a value of the DC component of the test voltage Utdc that is lower than the product Rs·Ig and transmits this value to the comparator 32. Since the DC component of the test voltage Utdc is lower than the reference value Vrdc (Vrdc=Rs·Ig or slightly lower so as to account for a normal DC leakage current in an installation), the comparator 32 transmits, to the microcontroller 35, the output signal 34 in the first state E21. The microcontroller 35 then interprets the change from the second state E22 to the first state E21 of the output signal 34 as being indicative of the presence of a break in the conductive sheath 7 or a current leak and sends an activation order 36 to the circuit breaker 9. This triggers, in an activation step, the activation of the circuit breaker 9, which breaks the electrical link 8.

Similarly, in the case of a fault in the inner insulating envelope 4a, a current leak appears between the electrical conductor 4 and the conductive sheath 7, in particular if they come into contact or if the space becomes small enough for a voltage breakdown to be triggered. The coupling between the electrical conductor 4 and the conductive sheath 7 is then no longer purely capacitive, which means that the phase shift $\varphi$ between the test voltage Ut and the attenuated main AC voltage Upat is comprised between $-\pi/2$ and zero. Consequently, the first term Pact of the formula for the instantaneous power value P is not equal to zero (see FIG. 8). The filtering step, carried out by the low-pass filter 27, makes it possible to obtain the nonzero active power Pact.

After the step of dividing the active power by the RMS voltage Ueff implemented by the divider element 22, the value of the reflection voltage Uact is obtained, which voltage reflects the active current passing through the shunt 15, which is also nonzero. The reflection voltage Uact is next transmitted by the active current measurement module 18 to the module for detecting deviation in the active and DC currents 20. As shown in FIG. 8, the comparison of the reflection voltage Uact with the reference value Vrac, by the comparator 29, shows that the reflection voltage Uact is higher than the reference voltage Vrac. The comparator 32 transmits, to the microcontroller 35, the output signal 31 in the first state E11. The microcontroller 35 then interprets the change from the second state E12 to the first state E11 of the output signal 31 as being indicative of the presence of a current leak and sends an activation order 36 to the circuit breaker 9. This triggers, in an activation step, the activation of the circuit breaker 9, which breaks the electrical link 8.

By way of example, the frequency F of the main AC voltage Up is 800 Hz. The fixed DC current generator 10 may deliver a bias current Ig of 0.5 A. Additionally, the value Rs of the shunt 15 is 20 ohms.

For example, the third-order bandpass filters have a low cut-off frequency of 100 Hz and a high cut-off frequency of 2000 Hz. Similarly, the low cut-off frequency of the third-order low-pass filters is 100 Hz.

Additionally, the DC voltage reference value Vrdc may be equal to 8 volts. In this example, the circuit breaker 9 is activated by the microcontroller 35 when the leakage current Ifdc from the conductive sheath 7 to the structure of the aircraft A exceeds the value of:

$$Ifdc=(Rs \cdot Ig - Vrdc)/Rs=0.1 \text{ A}.$$

The AC voltage reference value Vrac may be equal to 2 volts. In this case, the circuit breaker 9 is activated by the microcontroller 35 when the value of the leakage current Ifac between the electrical conductor 4 and the conductive sheath 7 is:

$$Ifac=Vrac/Rs=0.1 \text{ A}.$$

By way of example, it is considered that the length L of the electrical conductor 4 is 100 m, that the internal radius R1 of the electrical conductor 4 is 3.5 mm and that the internal radius R2 of the conductive sheath 7 is 7 mm. Additionally, the inner insulating envelope 4a may be made of polyethylene, the permittivity of which is $\varepsilon r=2.25 F/m$. In this case, the value of the capacitance C is 18030 pF. For a voltage Up of 540 V at 800 Hz, the value of the reactive current is 49 mA, and the value of the reactive voltage, i.e. the voltage reflecting the reactive current, across the terminals of the shunt is 977 mV.

The subject matter disclosed herein can be implemented in software in combination with hardware and/or firmware. For example, the subject matter described herein can be implemented in software executed by a processor or processing unit. In one exemplary implementation, the subject matter described herein can be implemented using a computer readable medium having stored thereon computer executable instructions that when executed by a processor of a computer control the computer to perform steps. Exemplary computer readable mediums suitable for implementing the subject matter described herein include non-transitory devices, such as disk memory devices, chip memory devices, programmable logic devices, and application specific integrated circuits. In addition, a computer readable medium that implements the subject matter described herein can be located on a single device or computing platform or can be distributed across multiple devices or computing platforms.

While at least one exemplary embodiment of the invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An electrical link for linking an AC high-voltage generator to a user apparatus, the electrical link comprising:
   an electrical conductor surrounded by a first inner insulating envelope;
   an electrical protection device comprising:
      a conductive sheath arranged around the inner insulating envelope;
      a fixed DC current generator connected to a current injection point of the conductive sheath;
      a circuit breaker that can be activated arranged on the electrical conductor and configured to break the electrical link when it is activated; and
      a detection module connected to a current tap-off point of the conductive sheath and to the circuit breaker, the detection module being configured to detect a current leak out of the electrical conductor and to activate the circuit breaker, the detection module comprising:
         a shunt connected by a first terminal between the tap-off point of the conductive sheath and a current measurement point and by a second terminal to a ground, a test voltage, reflecting a current passing through the shunt, being measured across the terminals of the shunt;
         an active current measurement module configured to produce a first voltage that is representative of an active current passing through the shunt, the first voltage being obtained on a basis of the measurement of the AC component of the test voltage;
         a DC current measurement module configured to produce a second voltage that is representative of the DC current passing through the shunt, the second voltage being obtained on a basis of measurement of DC component of the test voltage;
         a module for detecting deviation in the active and DC currents that is configured to compare values of the first and second voltages produced by the active and DC current measurement modules, respectively, with predetermined reference values and to activate or not to activate the circuit breaker depending on a result of the comparisons.

2. The electrical link according to claim 1, wherein the active current measurement module comprises:
   a multiplier element capable of being connected by a first input terminal to the AC high-voltage generator and by a second input terminal to the current measurement point, the multiplier element being configured to multiply a main AC voltage, generated by the AC high-voltage generator, by the test voltage to determine an instantaneous power value, the instantaneous power value being emitted by an output terminal; and
   a divider element capable of being connected by a first input terminal to the AC high-voltage generator and by a second input terminal to the output terminal of the multiplier element, the divider element being configured to divide the power value by the main AC voltage to determine the first voltage, the first voltage being present at an output terminal of the divider element.

3. The electrical link according to claim 2, wherein the active current measurement module comprises an attenuator element capable of being connected between the AC high-voltage generator and the first input terminal of the divider element, the attenuator element being configured to attenuate the main AC voltage by a predetermined factor in order to obtain an attenuated main AC voltage, the attenuated main AC voltage being emitted by an output terminal of the attenuator element.

4. The electrical link according to claim 3, wherein the active current measurement module comprises a first bandpass filter connected to the output terminal of the attenuator element.

5. The electrical link according to claim 1, wherein the active current measurement module comprises a converter element arranged between an output terminal of a first bandpass filter and a first input terminal of a divider element, the converter element configured to convert an attenuated main AC voltage, filtered by a first bandpass filter, into an RMS voltage.

6. The electrical link according to claim 1, wherein the active current measurement module comprises a second bandpass filter arranged between a current measurement point and a second input terminal of a multiplier element.

7. The electrical link according to claim 1, wherein the active current measurement module comprises a first low-pass filter between an output terminal of a multiplier element and a second input terminal of a divider element, the first low-pass filter being configured to filter an instantaneous power value in order to obtain a mean active power, the mean active power being emitted by an output terminal of the first low-pass filter.

8. The electrical link according to claim 1, wherein the DC current measurement module comprises a second low-pass filter arranged between the current measurement point and a second input terminal of the module for detecting deviation in the active and DC currents, configured to filter the test voltage in order to obtain the DC component of the test voltage, the DC component of the test voltage being emitted by an output terminal of the second low-pass filter.

9. The electrical link according to claim 1, wherein the module for detecting deviation in the active and DC currents is connected by a first input terminal to an output terminal of the AC voltage measurement module, by a second input terminal to an output terminal of the DC voltage measurement module and by an output terminal to the circuit breaker, the module for detecting deviation in the active and DC currents comprising:
   a first comparator element capable of being connected by a first input terminal to the output terminal of the active current measurement module and by a second input terminal to a DC voltage generator delivering a predetermined reference value, the first comparator element being configured to compare the value of the first voltage with the predetermined reference value and to emit a first output signal indicating whether the AC component of the first voltage is higher or lower than, or equal to, the predetermined reference value;
   a second comparator element capable of being connected by a first input terminal to the output terminal of the DC current measurement module and by a second input terminal to a DC voltage generator delivering a predetermined reference value, the second comparator element being configured to compare the value of the second voltage with the predetermined reference value and to emit a second output signal indicating whether the DC component of the test voltage is higher or lower than, or equal to, the predetermined reference value; and
   a microcontroller connected between an output terminal of each comparator and the circuit breaker, the microcontroller being configured to send an activation signal to the circuit breaker if the first output signal, received from the first comparator, indicates that the value of the first voltage is higher than the predetermined reference value and/or if the second output signal, received from the second comparator, indicates that the value of the second voltage is lower than the predetermined reference value.

10. The electrical link according to claim 1, wherein an outer insulating envelope surrounds the conductive sheath.

11. A method for secure supply of electrical power to a user apparatus of a vehicle via an electrical link connected between the user apparatus and a generator delivering a main AC high voltage, the vehicle including a ground-forming conductive structure, the electrical link comprising:
   an electrical conductor surrounded by an inner insulating envelope; and
   an electrical protection device comprising:
      a conductive sheath arranged around an inner insulating envelope;
      a fixed DC current generator connected to a current injection point of the conductive sheath;
      a circuit breaker that can be activated arranged on the electrical conductor and configured to break the electrical link when it is activated;
      a detection module comprising a shunt connected to an electrical link comprised between a tap-off point of the conductive sheath and a current measurement point and to a ground, an active current measurement module comprising a multiplier element comprising a first input terminal connected to the AC high-voltage generator, a second input terminal connected to the current measurement point and a divider element comprising a first input terminal connected to the AC high-voltage generator, a second input terminal connected to an output terminal of the multiplier element, and a DC current measurement module and a module for detecting deviation in the active and DC currents, the module for detecting deviation in the active and DC currents comprising a first comparator, a second comparator and a microcontroller; and
the method comprising the following successive steps:
   injecting a bias current by the fixed DC current generator at the current injection point;
   measuring the DC component of a test voltage across the terminals of the shunt, implemented by the DC current measurement module, the test voltage reflecting the current passing through the shunt;
   measuring the AC component of the test voltage across the terminals of the shunt, implemented by the active current measurement module;
   generating a first voltage that is representative of the active current passing through the shunt obtained on a basis of the measurement of the AC component of the test voltage, implemented by the active current measurement module;
   generating a second voltage that is representative of the DC current passing through the shunt obtained on a basis of the measurement of the DC component of the test voltage, implemented by the DC current measurement module;
   comparing the value of the first voltage and the value of the second voltage with predetermined reference values, respectively;
   monitoring, implemented by the microcontroller, the state of the output signal of the first comparator and/or of the second comparator, the state being either a first state if the first voltage is higher than the predetermined reference value and/or if the second voltage is lower than the predetermined reference value, the first state indicating a presence of a current leak between the electrical conductor and the conductive sheath, or a presence of a current leak out of the conductive sheath, or else a second state; and
   activating the circuit breaker, implemented by the microcontroller, if the output signal of the first comparator and/or of the second comparator is in the first state.

12. The method according to claim 11, wherein the step of generating the first voltage, implemented by the AC voltage measurement module, comprises the following successive steps:
   attenuating the main AC voltage, implemented by an attenuator element;
   filtering interference on the attenuated main AC voltage, implemented by a first bandpass filter;
   converting the attenuated and filtered main AC voltage into an RMS voltage, implemented by a converter element;
   filtering interference on the test voltage, implemented by a second bandpass filter that is identical to the first bandpass filter;
   multiplying the filtered test voltage by the attenuated main AC voltage resulting in an instantaneous power value, implemented by a multiplier element;
   filtering the DC component of the instantaneous power resulting in a mean active power implemented by the first low-pass filter; and
   dividing the mean active power by the RMS voltage, implemented by a divider element.

* * * * *